(12) United States Patent
Horiguchi (10) Patent No.: US 7,235,470 B2
(45) Date of Patent: Jun. 26, 2007

(54) SEMICONDUCTOR DEVICE AND MANUFACTURING METHOD THEREOF

(75) Inventor: Naoto Horiguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 10/806,247

(22) Filed: Mar. 23, 2004

(65) Prior Publication Data

US 2005/0087819 A1  Apr. 28, 2005

(30) Foreign Application Priority Data

Oct. 28, 2003  (JP) ............................ 2003-367930

(51) Int. Cl.
*H01L 21/265* (2006.01)
(52) U.S. Cl. .................... 438/519; 438/514; 438/527
(58) Field of Classification Search ................ 438/197, 438/301, 303, 585, 595, 199, 299, 305–306, 438/514, 527, 531, 529, 510, 519, 580, 766
See application file for complete search history.

(56) References Cited

U.S. PATENT DOCUMENTS

| | | | | | |
|---|---|---|---|---|---|
| 4,853,342 A | * | 8/1989 | Taka et al. | ................... | 438/283 |
| 5,286,665 A | | 2/1994 | Muragishi et al. | | |
| 5,366,915 A | * | 11/1994 | Kodama | ....................... | 438/257 |
| 5,776,811 A | * | 7/1998 | Wang et al. | ................. | 438/264 |
| 5,932,917 A | * | 8/1999 | Miura | ......................... | 257/358 |
| 6,030,869 A | * | 2/2000 | Odake et al. | ................ | 438/266 |
| 6,107,129 A | | 8/2000 | Gardner et al. | | |
| 6,238,978 B1 | * | 5/2001 | Huster | ........................ | 438/264 |
| 6,255,165 B1 | * | 7/2001 | Thurgate et al. | ............. | 438/257 |
| 6,297,098 B1 | * | 10/2001 | Lin et al. | ..................... | 438/264 |
| 6,297,535 B1 | * | 10/2001 | Gardner et al. | ............. | 257/344 |
| 6,380,044 B1 | * | 4/2002 | Talwar et al. | ................ | 438/308 |
| 6,503,844 B2 | * | 1/2003 | Curello | ........................ | 438/710 |
| 6,506,650 B1 | * | 1/2003 | Yu | ............................. | 438/301 |
| 6,509,219 B2 | * | 1/2003 | Tsou et al. | ................... | 438/197 |
| 6,649,460 B2 | * | 11/2003 | Leobandung | ............... | 438/183 |
| 6,794,258 B2 | * | 9/2004 | Makabe et al. | ............. | 438/287 |
| 6,875,668 B2 | * | 4/2005 | Nguyen et al. | ............. | 438/386 |
| 2001/0028086 A1 | * | 10/2001 | Makabe et al. | ............. | 257/344 |
| 2002/0068394 A1 | * | 6/2002 | Tokushige et al. | .......... | 438/183 |

FOREIGN PATENT DOCUMENTS

| | | |
|---|---|---|
| JP | 6-224381 | 8/1994 |
| JP | 2003-031798 | 1/2003 |
| TW | 257668 | 4/2003 |

\* cited by examiner

*Primary Examiner*—Zandra V. Smith
*Assistant Examiner*—Thanh Y. Tran
(74) *Attorney, Agent, or Firm*—Westerman, Hattori, Daniels & Adrian, LLP.

(57) ABSTRACT

A semiconductor device is provided, which aims to reduce the standby power thereof by reducing the leak between a body and a drain with restraining the effect on a threshold voltage, in order to actualize the highly reliable semiconductor device. When extension regions are formed, an n-type impurity less diffusive than phosphorus ($P^+$), for example, arsenic ($As^+$) is used as an impurity. In addition to ordinary ion implantation with high dose (high concentration) and low acceleration energy, $As^+$ ions are implanted with low dose and high acceleration energy.

10 Claims, 13 Drawing Sheets

PRIOR ART

FIG. 2B

PRESENT INVENTION

Pwell−II(B⁺)
NVT−II(B⁺)

IMPLANTATION OF EXTENSION
As⁺20∼30keV1∼3e13t0
+As⁺0.5∼5keV0.5∼2.5e15t0
(DOUBLE As⁺ IMPLANTATION)

IMPLANTATION OF POCKET
B⁺5∼7keV
6∼15e12×4t28

Pwell−II(B⁺)
NVT−II(B⁺)

IMPLANTATION OF EXTENSION
As⁺20~30keV1~3e13t0
+As⁺0.5~5keV0.5~2.5e15t0
(DOUBLE As⁺ IMPLANTATION)

IMPLANTATION OF POCKET
B⁺7~10keV
6~15e12×4t28

Ioff=GD LEAK+SD LEAK+BD LEAK

SEMICONDUCTOR DEVICE AND MANUFACTURING METHOD THEREOF

CROSS-REFERENCE TO RELATED APPLICATIONS

This application is based upon and claims the benefit of priority from the prior Japanese Patent Application No. 2003-367930, filed on Oct. 28, 2003, the entire contents of which are incorporated herein by reference.

BACKGROUND OF THE INVENTION

1. Field of the Invention

The present invention relates to a semiconductor device in which a source/drain is formed into two-layer structure having shallow and deep junctions, and a manufacturing method thereof.

2. Description of the Related Art

Recently, it has become valued to reduce the standby power of a semiconductor chip, with the wide use of a cellular phone, a PDA (personal digital assistants) and the like. As a direct method for reducing the standby power of the semiconductor chip, it is known to reduce the off-state current ($I_{off}$) of a transistor. In the concrete, since a high threshold voltage ($V_{th}$) achieves low $I_{off}$, the dose of ion implantation for forming pocket regions, which are provided to improve the roll-off characteristics of the threshold voltage ($V_{th}$) and current drive capacity, and for controlling $V_{th}$ is increased for the purpose of obtaining high $V_{th}$.

Patent document 1: Japanese Patent Application Laid-Open No. 2003-31798.

Patent document 2: Japanese Patent Application Laid-Open No. 6-224381.

A highly scaled transistor having short gate length (Lg), however, has an abrupt junction and high channel impurity concentration. Thus, increase in the dose of ion implantation for forming the pocket regions and controlling $V_{th}$ can increase $V_{th}$, but also increase the leak between a body (a substrate and a semiconductor region) and a drain. As a result, there is a problem that $I_{off}$ is increased.

This situation will be described with reference to FIGS. 11 and 12.

Figure 11:
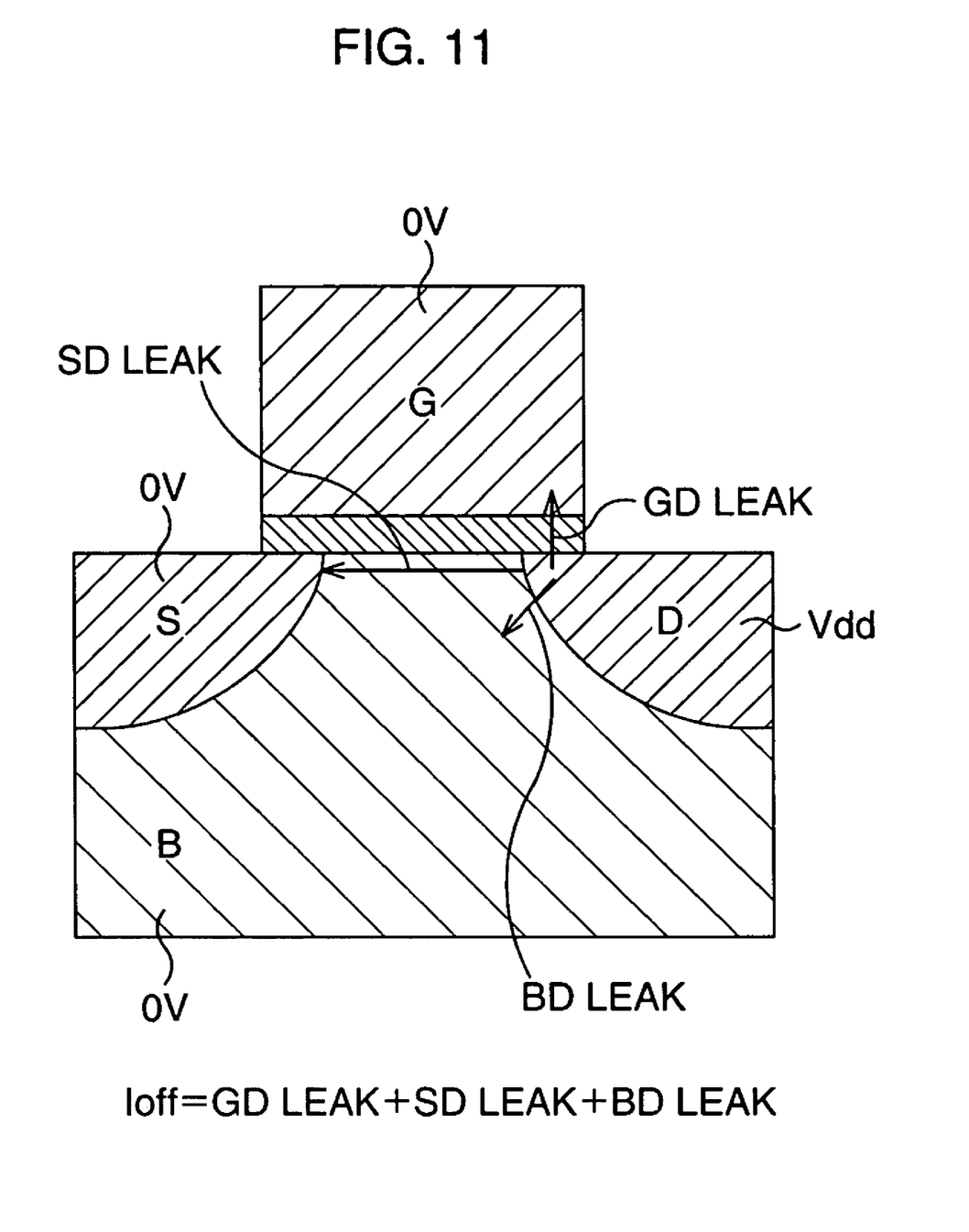
FIG. 11 is a schematic sectional view of a transistor which explains the current components of $I_{off}$.
Figure 12:
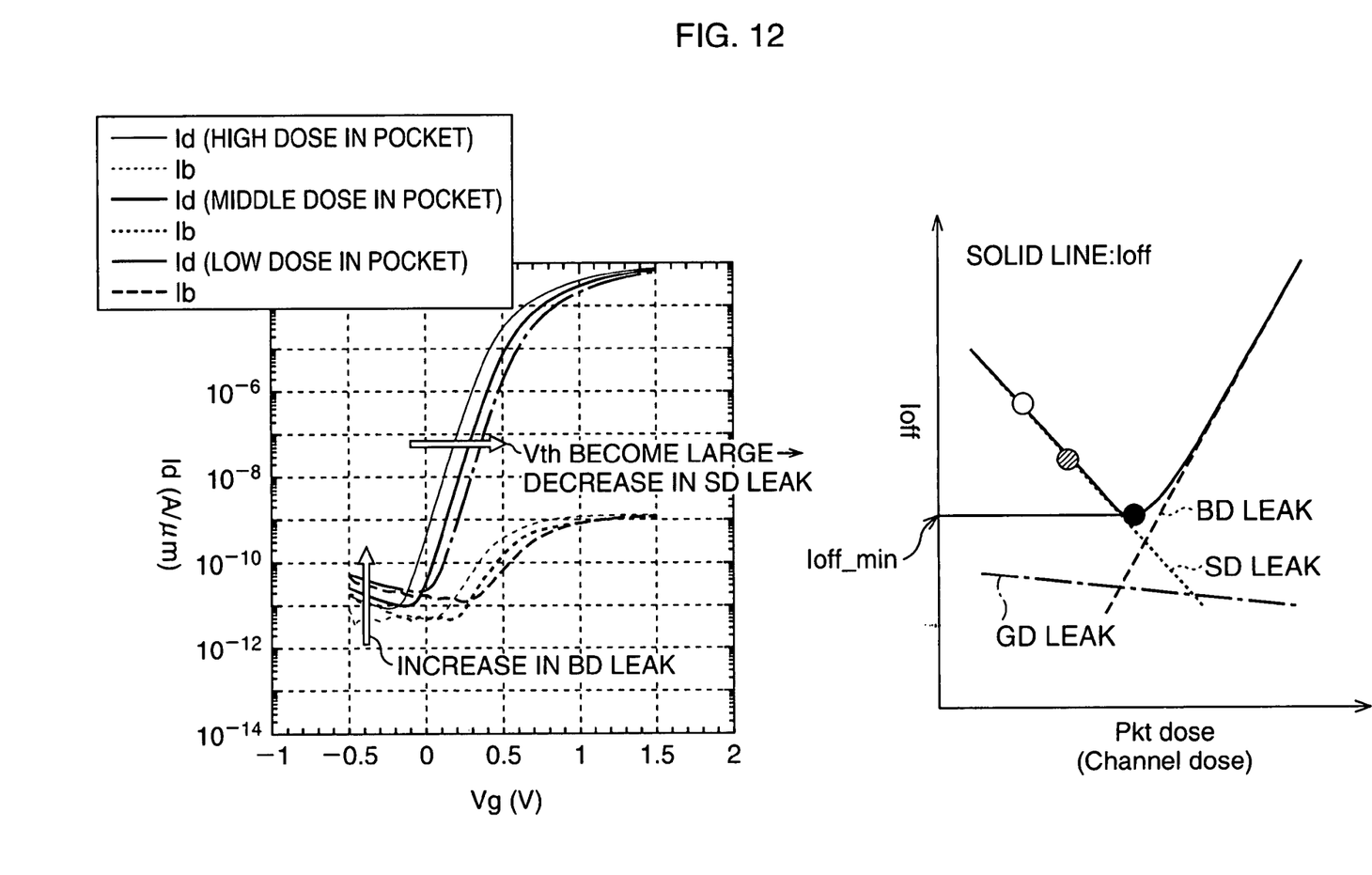
FIG. 12 is a graph showing variation in the Vg-Id characteristic of transistors, when the dose of ion implantation for forming pocket regions is increased.

FIG. 11 is a schematic sectional view of a transistor which explains the current components of $I_{off}$. $I_{off}$ is expressed by the sum of the leak between the gate and a drain (GD leak), the leak between a source and the drain (SD leak), and the leak between a body and the drain (BD leak). FIG. 12 shows variation in the gate voltage-drain current (Vg-Id) characteristic of transistors having a gate length of 80 nm, when the dose of ion implantation for forming the pocket regions is increased.

Figure 13:
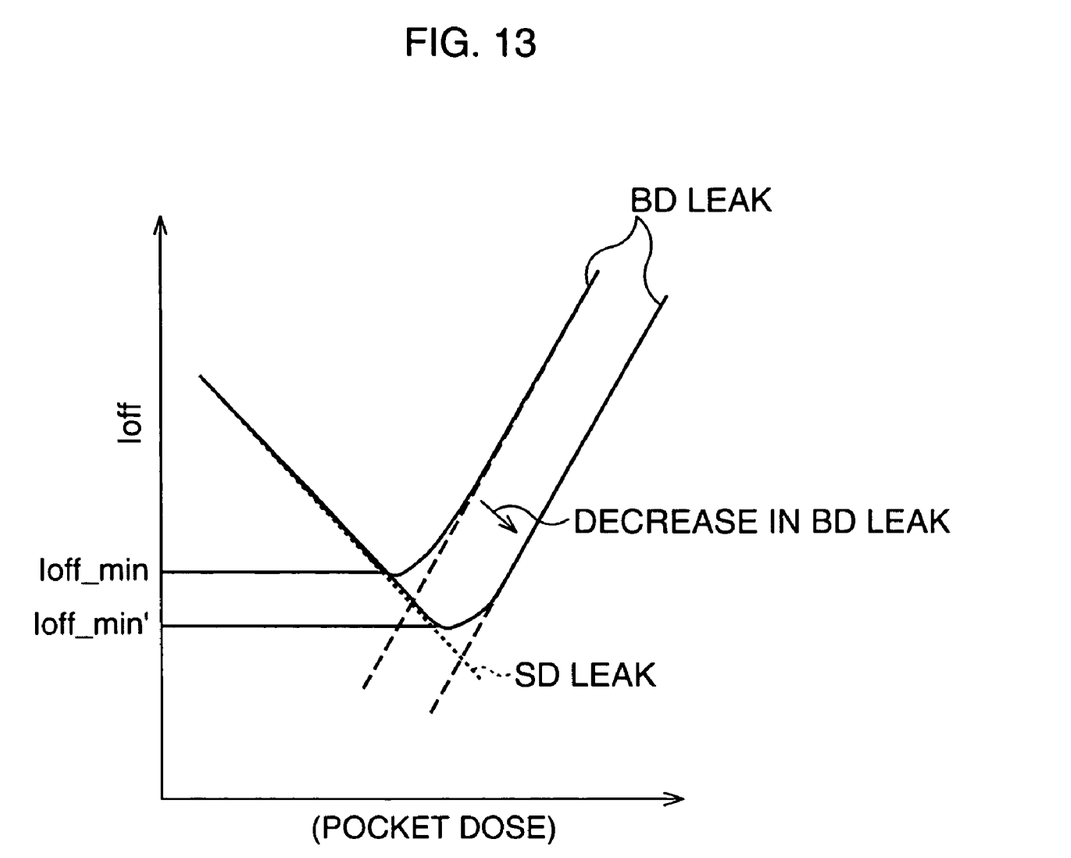
FIG. 13 is a graph sowing the relation between the dose of a channel (pocket region) and $I_{off}$ of the transistor.

$V_{th}$ increases as the dose for forming the pocket regions increases. When the dose exceeds a certain value, however, $I_{off}$ depends on the BD leak due to increase in the BD leak, so that $I_{off}$ is minimized before the certain value. If the BD leak is restrained without varying $V_{th}$ of the transistor, as shown in FIG. 13, it becomes possible to actualize lower $I_{off}$.

Ordinary, phosphorus ($P^+$) is used for forming the extension regions (or an LDD layer), in order to reduce the BD leak of an n-type MOS transistor. In this method, however, since the diffusion of $P^+$ is large, $V_{th}$ decreases in the transistor having a short gate length, so that $I_{off}$ does not become lower.

SUMMARY OF THE INVENTION

Considering the above problems, an object of the present invention is to provide a highly reliable semiconductor device and a manufacturing method thereof, in which the leak between a body and a drain is reduced with restraining effect on a threshold voltage ($V_{th}$) to reduce standby power.

A method for manufacturing a semiconductor device according to the present invention comprises the steps of forming a gate on a semiconductor region in a pattern; forming a first junction by doping an n-type impurity less diffusive than phosphorus in a surface layer of the semiconductor region by using the gate as a mask; and forming a second junction by doping an n-type impurity in the surface layer of the semiconductor region by using at least the gate as a mask. The second junction, which is deeper than the first junction, overlaps with the first junction with leaving a part of the first junction existing under the gate. The step of forming the first junction includes at least a first ion implantation which is carried out with a first acceleration energy and a first dose, and a second ion implantation which is carried out with a second acceleration energy higher than the first acceleration energy and a second dose lower than the first dose.

A semiconductor device according to the present invention comprises a gate, a source and a drain. The source and the drain include a first junction and a second junction in which an n-type impurity less diffusive than phosphorus is doped. The second junction, which is deeper than the first junction, overlaps with the first junction with leaving a part of the first junction existing under the gate. In the lower portion of the first junction, there is a decline region of the concentration of the low diffusive n-type impurity. A width of the decline region expands with getting near a gate end in the inside of the gate end, and becomes approximately even in the outside of the gate end.

According to the present invention, standby power is reduced because the leak between a body and the drain is reduced with restraining the effect on a threshold voltage ($V_{th}$). Therefore, it is possible to realize a highly reliable semiconductor device.

DETAILED DESCRIPTION OF THE PREFERRED EMBODIMENTS

Essential Features of the Present Invention

First, essential features of the present invention will be described.

The inventor has found that weakening the electric field between an extension region as a shallow junction and a channel, in other words, smoothing the impurity concentration profile between the extension region and the channel makes it possible to reduce the BD leak.

In the present invention, to smooth the impurity concentration profile, when the extension regions are formed, an n-type impurity less diffusive than phosphorus ($P^+$), for example, arsenic ($As^+$) is used as an impurity, and the second ion implantation is carried out with high acceleration energy and low dose, in addition to the ordinary first ion implantation with low acceleration energy and high dose (high concentration). The first ion implantation is hereinafter referred to as $E_L D_H$ ion implantation, and the second ion implantation is referred to as $E_H D_L$ ion implantation, for the sake of convenience.

Figure 1A:
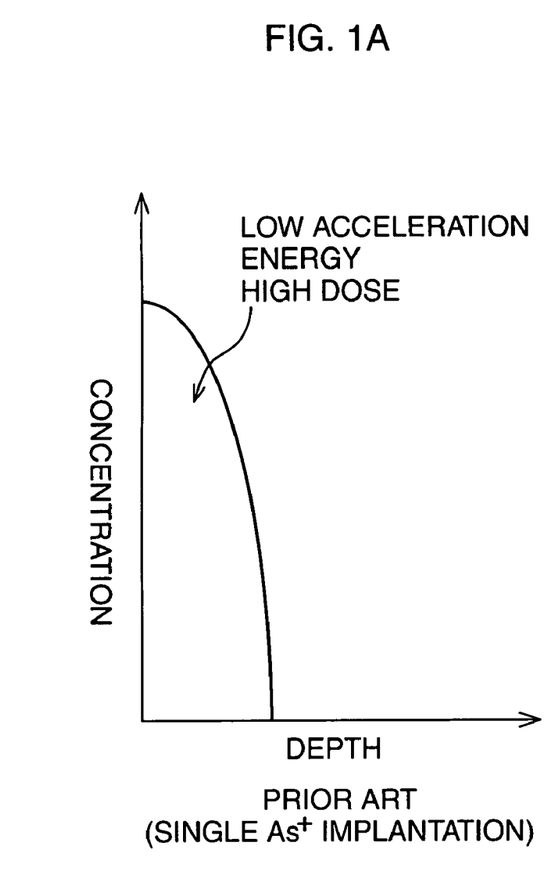
FIG. 1A is a graph showing an impurity concentration profile according to the prior art.
Figure 1B:
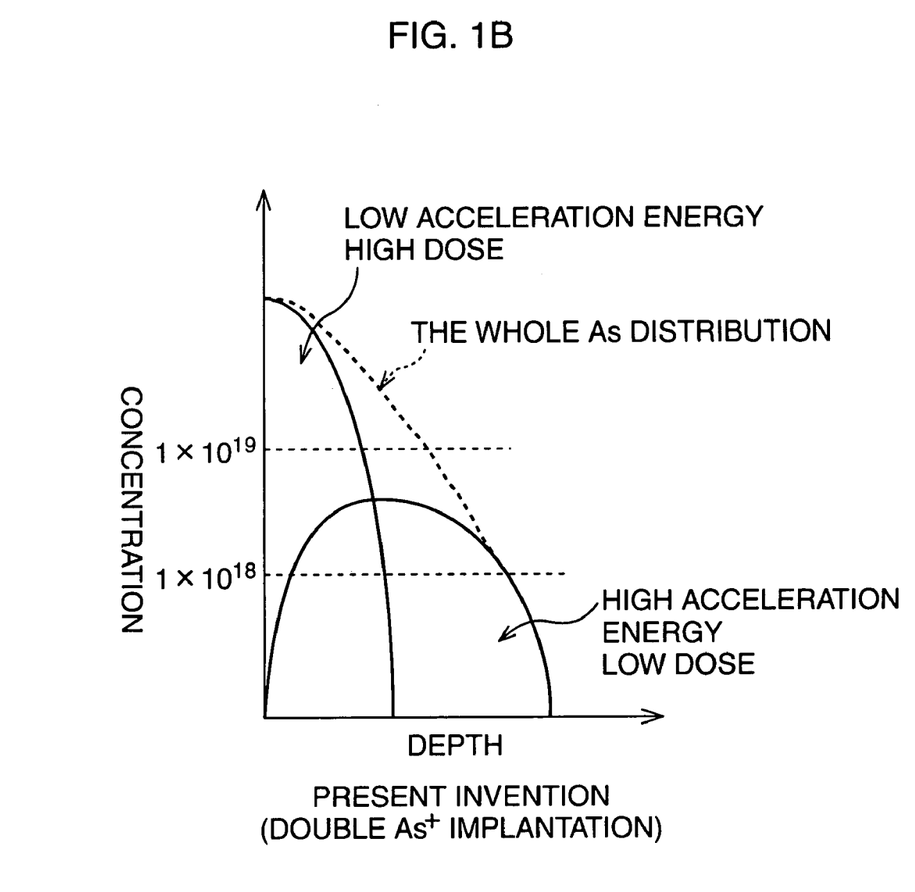
FIG. 1B is a graph showing an impurity concentration profile in an extension region formed in the present invention.

FIGS. 1A and 1B show this situation. FIG. 1A is in a case where the extension regions are formed by single ion implantation as usual, and FIG. 1B is in a case where the extension regions are formed by double ion implantation according to the present invention. In both FIGS. 1A and 1B, the horizontal axis represents depth from the surface of a semiconductor region (semiconductor substrate), and the vertical axis represents the concentration of As. Referring to a broken line in FIG. 1B, the double ion implantation smooth the impurity concentration profile of the extension region as a whole, so that the BD leak is reduced. In this case, it is possible to further increase dose in forming pocket regions, in accordance with decrease in the BD leak, and hence low $I_{off}$ is actualized in a transistor with shorter gate length.

Figure 2A:
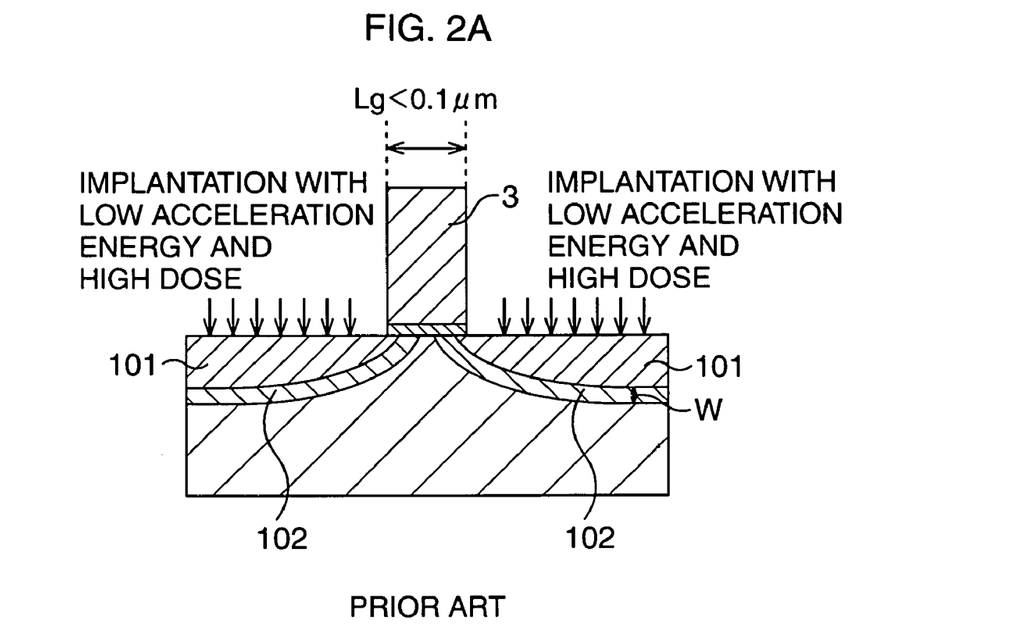
FIG. 2A is a schematic sectional view showing extension regions according to the prior art.
Figure 2B:
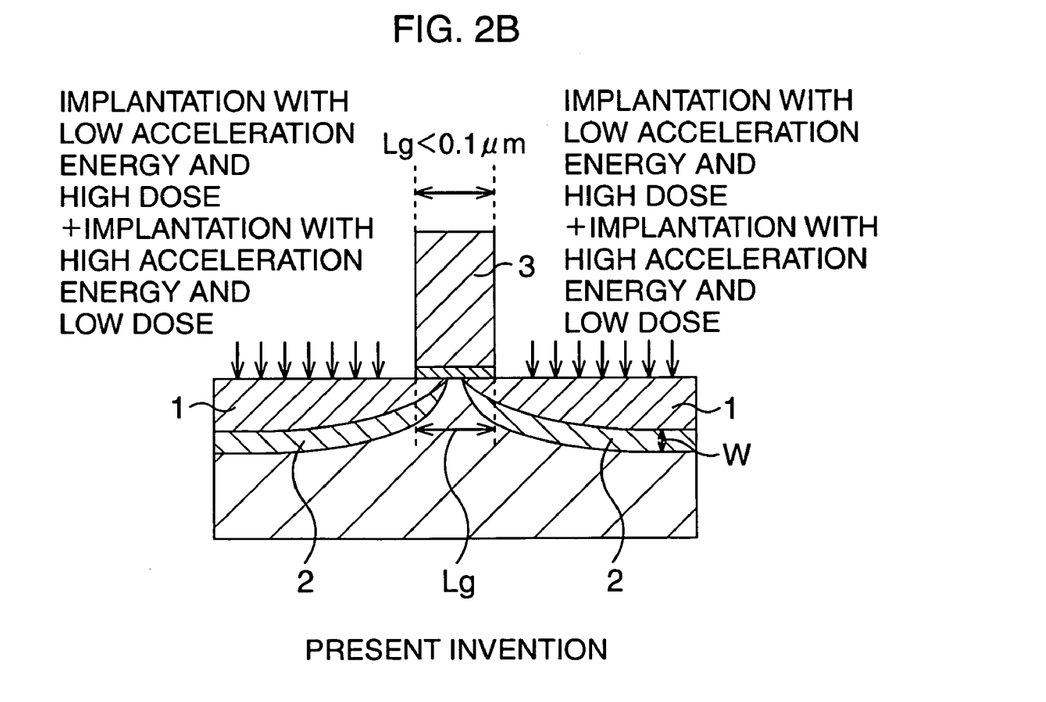
FIG. 2B is a schematic sectional view showing the extension regions, which are formed by $As^+$ ion implantation with the use of a gate electrode as a mask, according to the present invention.

FIGS. 2A and 2B show the extension regions formed by $As^+$ ion implantation with the use of a gate electrode as a mask. FIG. 2A is in a case where the extension regions are formed by the single ion implantation as usual, and FIG. 2B is in a case where the extension regions are formed by the double ion implantation according to the present invention.

In FIG. 2A, reflecting the impurity concentration profile of FIG. 1A, are formed extension regions 101 having an As decline region (region in which the concentration of As decreases as depth from the surface of the substrate becomes large) the width W of which is relatively narrow and even in the lower portion thereof. In FIG. 2B, on the other hand, reflecting the impurity concentration profile of FIG. 1B, extension regions 1 are formed. In the lower portion of the extension region 1, there is an As decline region 2, the width W of which expands with getting near the end of a gate electrode 3 (a gate end) in the inside of the gate end, and becomes approximately even in the outside of the gate end. Namely in the inside of the gate end, as shown by broken lines of FIG. 2B, the width of a depletion layer of FIG. 2B gets closer to the width of a depletion layer of FIG. 2A, with getting near the center of the gate electrode 3. In the outside of the gate end, on the other hand, the width of the depletion becomes almost even and wider than that of FIG. 2A, and hence the concentration profile becomes smooth.

Using the less diffusive n-type impurity as a dopant has the advantages that a smooth impurity concentration profile is easily formed in a desired portion, and there is little effect on roll-off characteristic, and the BD leak is reduced without having effect on $V_{th}$. $As^+$ is used as the less diffusive n-type impurity in this embodiment, but the less diffusive n-type impurity is not limited to it, as long as the amount of diffusion thereof is less than that of $P^+$.

Figure 3:
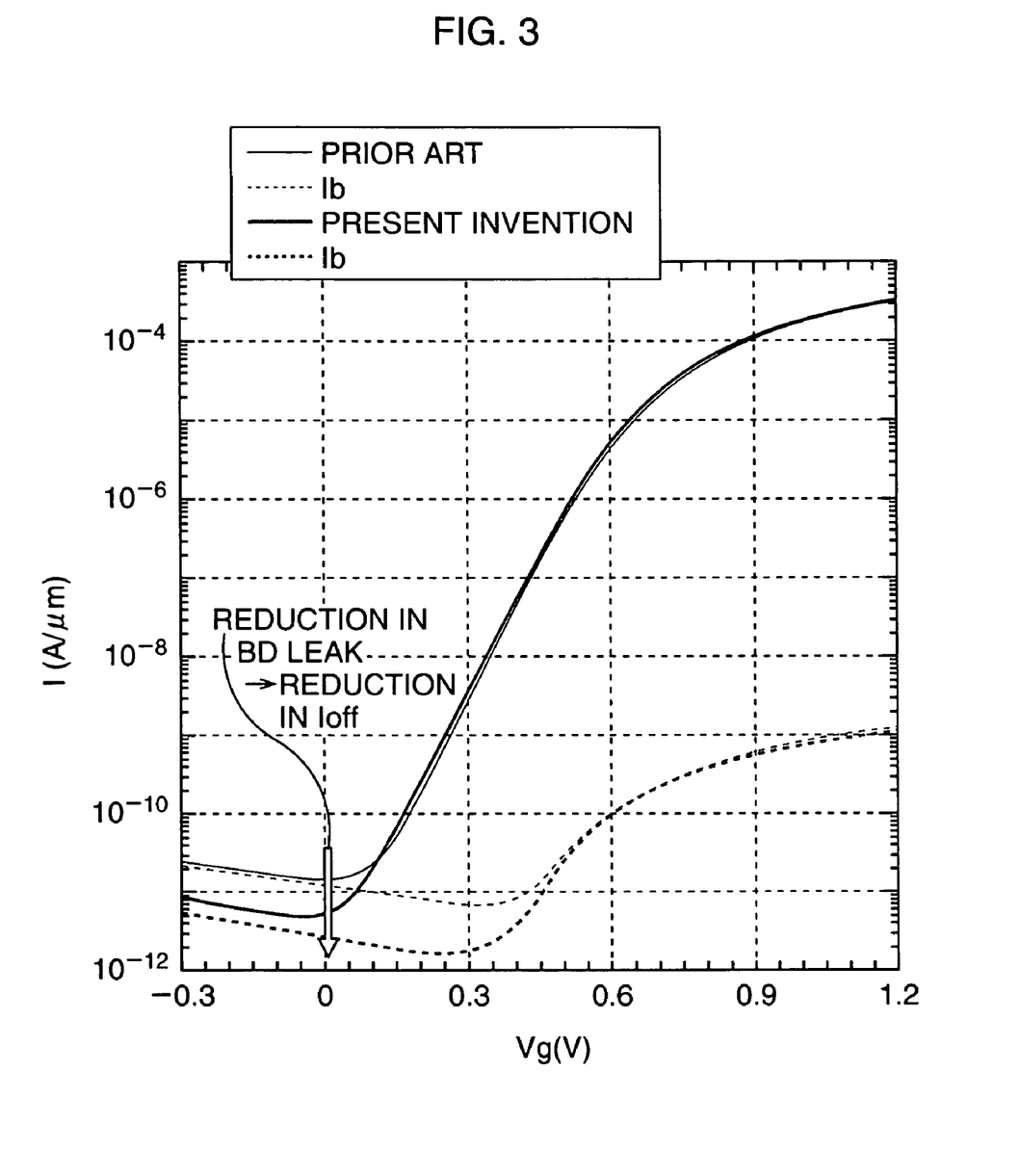
FIG. 3 is the graph of a Vg-Id characteristic in a case where the extension regions are formed by double $As^+$ ion implantation according to the present invention, as compared with a case of ordinary single $As^+$ ion implantation.

FIG. 3 is the graph of a Vg-Id characteristic in a case where the extension regions are formed by the double $As^+$ ion implantation according to the present invention, as compared with a case of ordinary single $As^+$ ion implantation. As apparent from FIG. 3, the double ion implantation restrains the BD leak.

Based on the above described superiority of the double ion implantation according to the present invention, the experimental results of concrete and appropriate condition for the ion implantation will be hereinafter described.

Figure 4A:
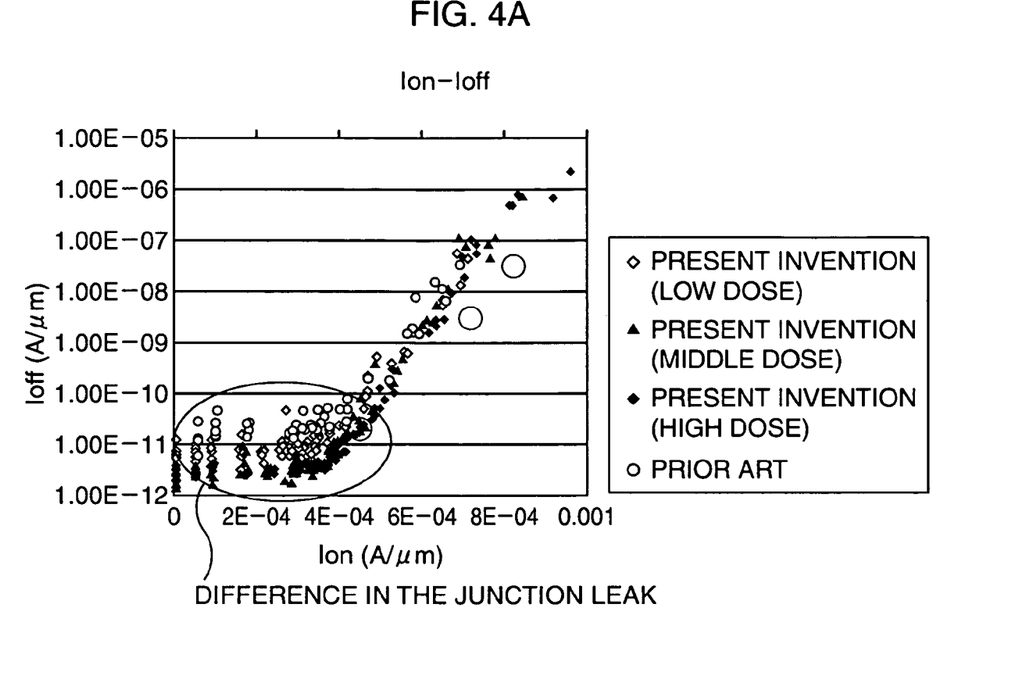
FIGS. 4A and 4B are graphs showing an $I_{on}$-$I_{off}$ characteristic and a roll-off characteristic according to the present invention, respectively, when the condition of $E_H D_L$ ion implantation of double $As^+$ ion implantation is changed.
Figure 4B:
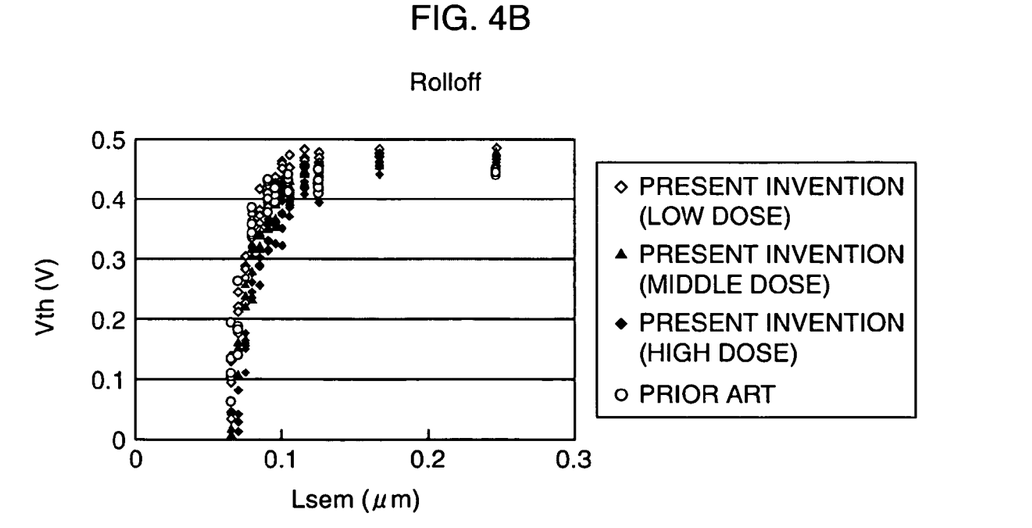

FIGS. 4A and 4B show an $I_{on}$-$I_{off}$ characteristic and a roll-off characteristic, respectively, when the condition of the $E_H D_L$ ion implantation of the double $As^+$ ion implantation is changed. In the $E_H D_L$ ion implantation, the dose is increased with constant (20 keV) acceleration energy.

As apparent from the drawings, junction leak is traded off for the roll-off characteristic. In other words, the junction leak decreases as the dose increases, but the degradation in the roll-off characteristic causes reduction in $V_{th}$, so that $I_{off}$ increases as a result.

Figure 5:
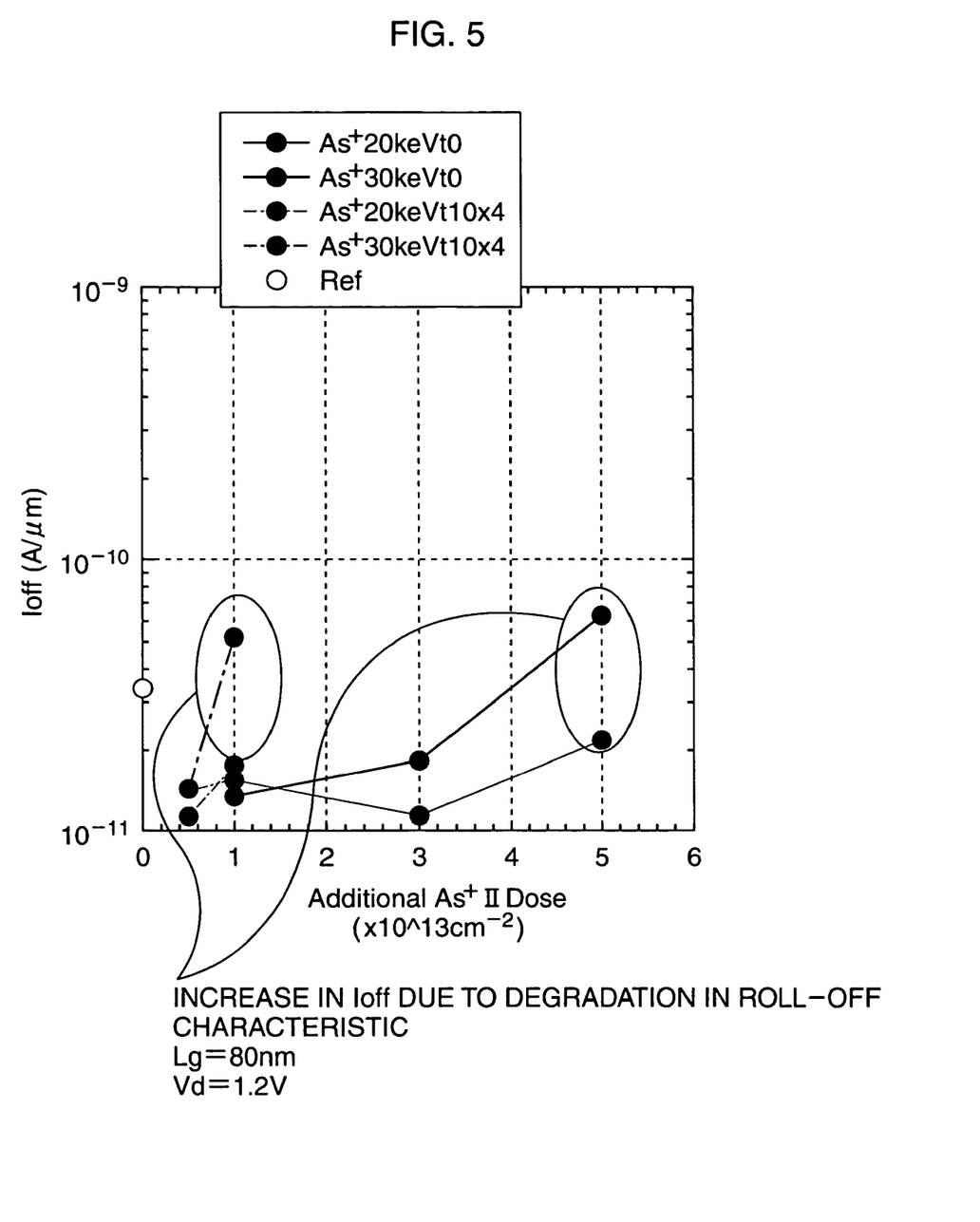
FIG. 5 is a graph showing the relation between the condition of $E_H D_L$ ion implantation (does) of double $As^+$ ion implantation according to the present invention and $I_{off}$.

Based on the foregoing result, FIG. 5 shows the relation between the condition of the $E_H D_L$ ion implantation (does) of the double $As^+$ ion implantation according to the present invention and $I_{off}$.

Referring to FIG. 5, it is found that the proper condition of the $E_H D_L$ ion implantation, which restrains both of the junction leak and $I_{off}$, is the acceleration energy of 20 keV to 30 keV and the dose of $1 \times 10^{13}/cm^2$ to $3 \times 10^{13}/cm^2$, when the dopant is $As^+$.

In this embodiment, the extension region is formed by the double ion implantation, but ion implantation may be carried out at, for example, three times or more. Taking a case of triple ion implantation, the $E_H D_L$ ion implantation and the third ion implantation ($E_M D_M$ ion implantation), which adopts mid-values of acceleration energy and dose between those of the $E_L D_H$ ion implantation and the $E_H D_L$ ion implantation, are carried out in addition to the ordinary $E_L D_H$ ion implantation. Therefore, it is possible to actualize the extension regions in which the impurity concentration profile declines further smoothly.

Concrete Embodiments of the Present Invention

In the following embodiments, the schematic structure of MOS transistors according to the present invention will be described with manufacturing methods thereof.

First Embodiment

FIGS. 6A to 6C and FIGS. 7A to 7B are schematic sectional views showing a manufacturing method of a MOS transistor according to a first embodiment in processing order.

Figure 6A:
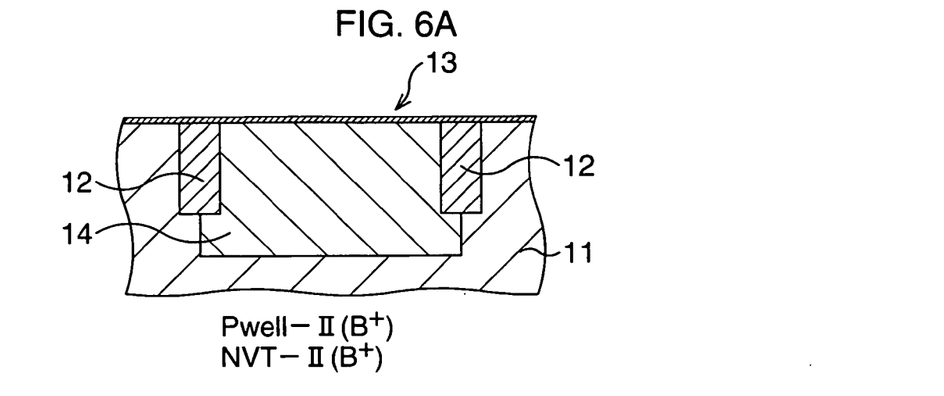
FIGS. 6A to 6C are schematic sectional views showing a manufacturing method of a MOS transistor according to a first embodiment in processing order.

First, as shown in FIG. 6A, device isolation structure is formed in a device isolation region of a silicon semiconductor substrate 11. Concretely, device isolation structure 12 is formed to delimit an active region 13 by use of a STI (Shallow Trench Isolation) method, by which insulating material is embedded in a groove formed in the device isolation region. Then, a p-type impurity, for example, boron ($B^+$) ions are implanted in the active region 13 to form a p-well 14. Boron ($B^+$) ions are further implanted in the surface layer of the p-well 14 to control a threshold voltage ($V_{th}$).

Figure 6B:
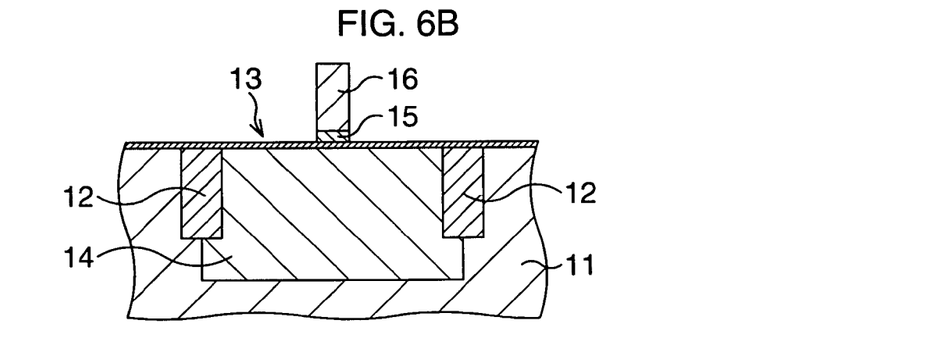

Then, as shown in FIG. 6B, after a gate insulating film 15 is formed on the surface of the p-well 14 by an oxidation method, a polycrystalline silicon film deposited by a CVD method (and the gate insulating film 15) is processed by photolithography and dry etching, to form a gate electrode 16 in a pattern.

Figure 6C:
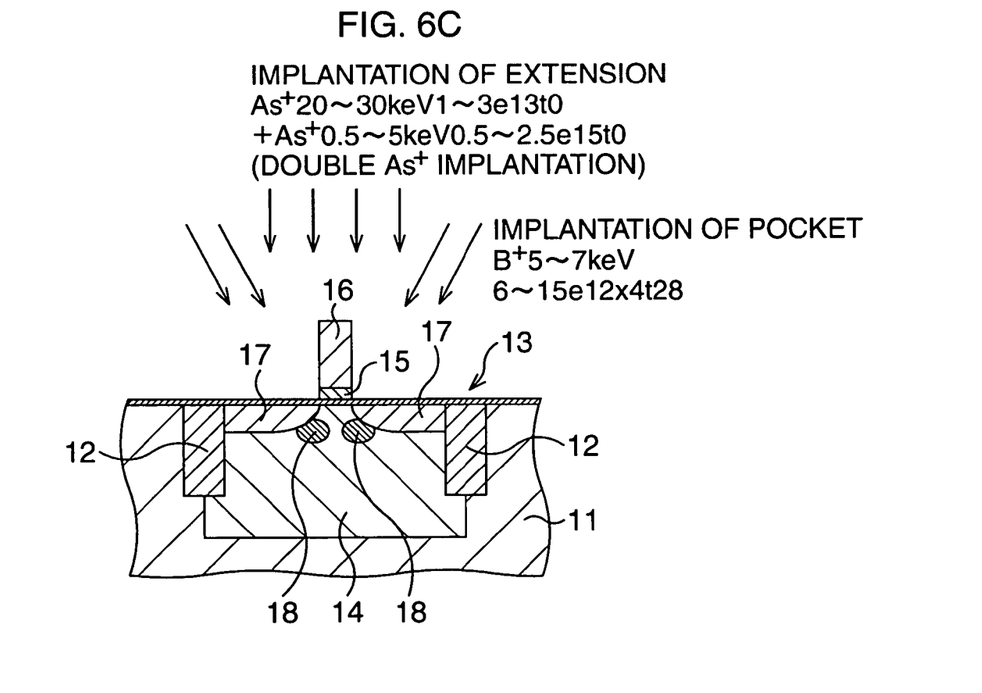

Then, as shown in FIG. 6C, extension regions 17 as shallow junction are formed by double ion implantation. To be more specific, an n-type impurity less diffusive than phosphorus ($P^+$), for example, arsenic ($As^+$) ions are implanted with high acceleration energy and low dose in the surface layer of the semiconductor substrate 11 on both sides of the gate electrode 16 by use of the gate electrode 16 as a mask ($E_H D_L$ ion implantation). Then, $As^+$ ions are further implanted with lower acceleration energy and higher dose than those of $E_H D_L$ ion implantation ($E_L D_H$ ion implantation), to form the extension regions 17. The $E_H D_L$ ion implantation is carried out on the condition that the acceleration energy is 20 keV to 30 keV, the dose is $1 \times 10^{13}/cm^2$ to $3 \times 10^{13}/cm^2$, and a tilt angle (represented by "t" in the drawings) is 0° (a direction vertical to the substrate). The $E_L D_H$ ion implantation is carried out on the condition that the acceleration energy is 0.5 keV to 5 keV, the dose is $0.5 \times 10^{15}/cm^2$ to $2.5 \times 10^{15}/cm^2$, and the tilt angle is 0°.

Then, in a like manner, a p-type impurity, for example, boron ($B^+$) ions are implanted from four directions with the acceleration energy of 5 keV to 10 keV, the dose of $6 \times 10^{12}/cm^2$ to $15 \times 10^{12}/cm^2$, and the tilt angle of 28° by use of the gate electrode 16 as a mask, to form pocket regions 18. Then, anneal processing is carried out at a predetermined temperature, in order to activate As in the extension regions 17.

Figure 7A:
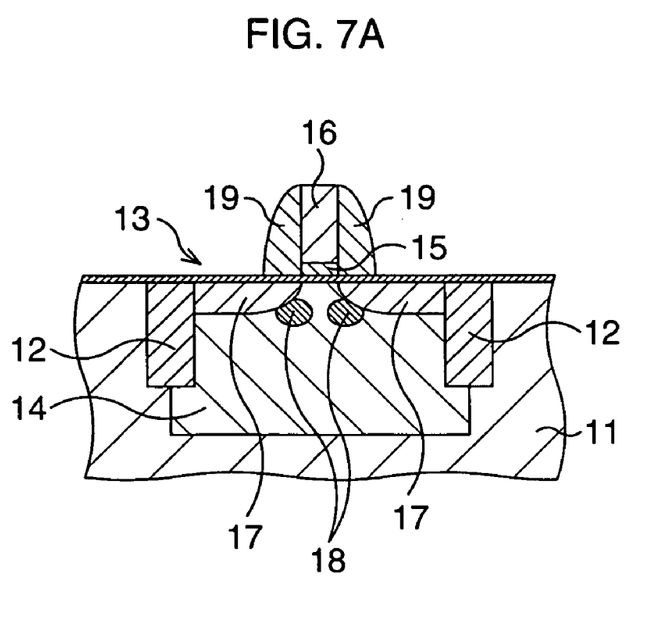
FIGS. 7A and 7B are schematic sectional views showing the manufacturing method of the MOS transistor according to the first embodiment in processing order, as a follow-up to FIG. 6C.

Then, as shown in FIG. 7A, a silicon oxide film is deposited on the whole surface of the semiconductor substrate 11 by the CVD method. Since the whole surface of the silicon oxide film is processed by anisotropic dry etching (etch back), the silicon oxide film left on both sides of the gate electrode 16 (and the gate insulating film 15) forms side walls 19.

Figure 7B:
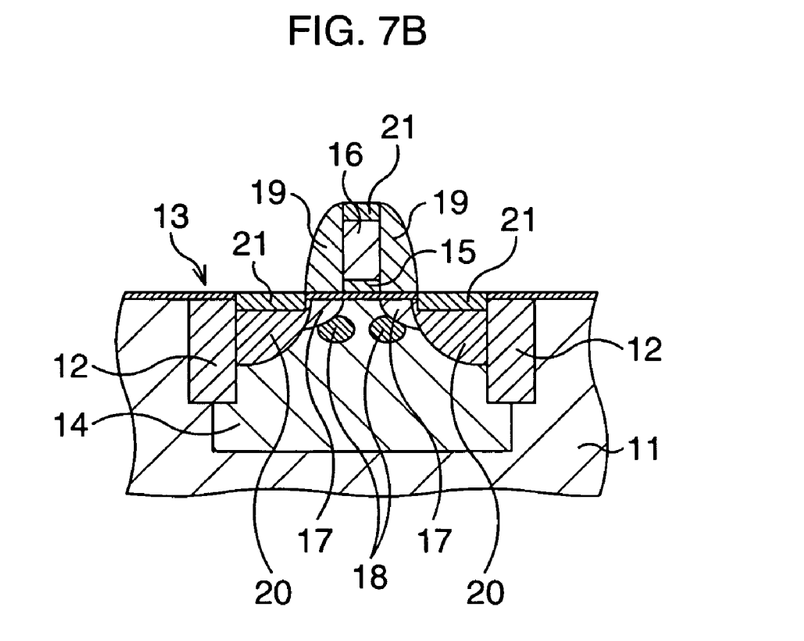

Then, as shown in FIG. 7B, an n-type impurity, for example, phosphorus ($P^+$) ions are implanted in the surface layer of the semiconductor substrate 11 by use of the gate electrode 16 and the side walls 19 as a mask. Thus, a source/drain 20 as a deep junction is so formed as to overlap with the extension regions 17 with leaving parts of the extension regions 17 existing under the gate electrode 16. Then, anneal processing is carried out at a predetermined temperature, in order to activate As in the source/drain 20.

Then, silicide layers, for example, CoSi layers 21 are formed in each surface of the gate electrode 16 and the source/drain 20 by the so-called salicide process, and unreacted Co is removed. After that, an interlayer insulating film covering the whole surface is formed, and various wiring processes and the like are carried out to complete the MOS transistor.

According to this embodiment, standby power is reduced because the leak between a body and the drain is reduced with restraining the effect on the threshold voltage ($V_{th}$). Therefore, it is possible to realize the highly reliable MOS transistor.

MODIFICATION EXAMPLE

The modification example of the first embodiment will be hereinafter described. In the following description, the extension regions are formed by triple ion implantation.

Figure 8:
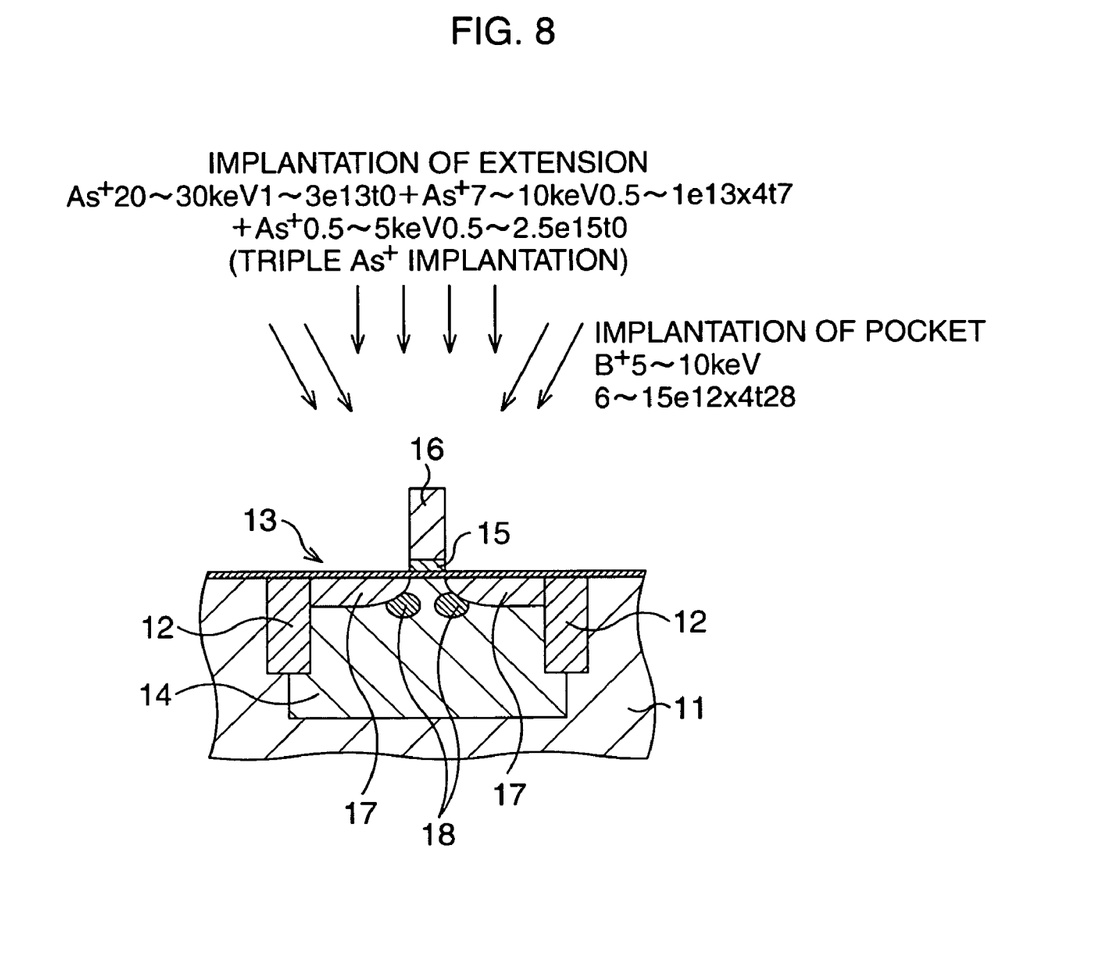
FIG. 8 is a schematic sectional view showing only a main process in a modification example of the manufacturing method of the MOS transistor according to the first embodiment.

After the process of FIG. 6A, as shown in FIG. 8, extension regions 31 as shallow junctions are formed by triple ion implantation. To be more specific, an n-type impurity less diffusive than phosphorus ($P^+$), for example, arsenic ($As^+$) ions are implanted with high acceleration energy and low dose in the surface layer of the semiconductor substrate 11 on both sides of the gate electrode 16 by use of the gate electrode 16 as a mask ($E_H D_L$ ion implantation). Then, $As^+$ ions are implanted with lower acceleration energy and higher does than those of $E_H D_L$ ion implantation ($E_M D_M$ ion implantation), and then $As^+$ ions are further implanted with lower acceleration energy and higher dose than those of $E_M D_M$ ion implantation ($E_L D_H$ ion implantation), to form the extension regions 31. The $E_H D_L$ ion implantation is carried out on the condition that the acceleration energy is 20 keV to 30 keV, the dose is $1 \times 10^{13}/cm^2$ to $3 \times 10^{13}/cm^2$, and a tilt angle is 0°. The $E_M D_M$ ion implantation is carried out from four directions (four times) on the condition that the acceleration energy is 7 keV to 10 keV, the dose is $0.5 \times 10^{13}/cm^2$ to $1 \times 10^{13}/cm^2$, and a tilt angle is 7°. The $E_L D_H$ ion implantation is carried out on the condition that the acceleration energy is 0.5 keV to 5 keV, the dose is $0.5 \times 10^{15}/cm^2$ to $2.5 \times 10^{15}/cm^2$, and the tilt angle is 0°. Therefore, it is possible to form the extension regions 31, the impurity concentration profile of which declines further smoothly.

Then, as in the case of the first embodiment, after the pocket regions 18 are formed, As in the extension regions 31 is activated by the anneal processing at the predetermined temperature, and then each process shown in FIGS. 6C, 7A and 7B is carried out to complete the MOS transistor.

Second Embodiment

In a second embodiment, a MOS transistor is manufactured as with the first embodiment except that a gate electrode takes the shape of a notch.

FIGS. 9A to 9C and FIGS. 10A to 10B are schematic sectional views showing a manufacturing method of a MOS transistor according to the second embodiment in processing order.

Figure 9A:
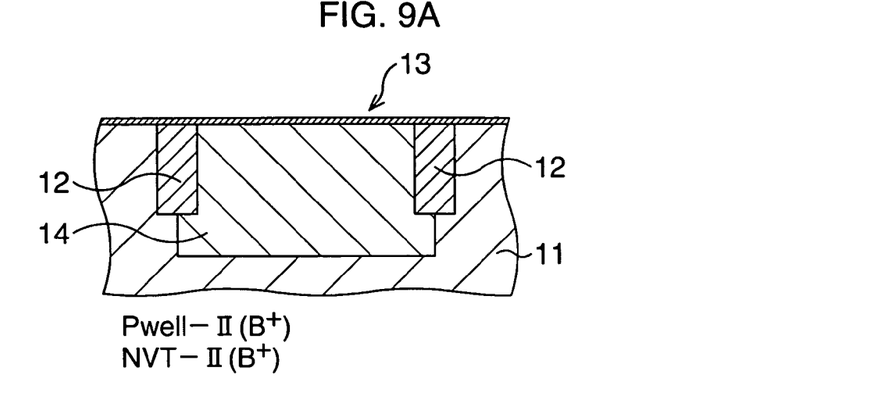
FIGS. 9A to 9C are schematic sectional views showing a manufacturing method of a MOS transistor according to a second embodiment in processing order.

First, as shown in FIG. 9A, device isolation structure is formed in a device isolation region of a silicon semiconductor substrate 11. Concretely, device isolation structure 12 is formed to delimit an active region 13 by use of the STI (Shallow Trench Isolation) method, by which insulating material is embedded in a groove formed in the device isolation region. Then, a p-type impurity, for example, boron (B⁺) ions are implanted in the active region 13 to form a p-well 14. Boron (B⁺) ions are further implanted in the surface layer of the p-well 14 to control a threshold voltage ($V_{th}$).

Figure 9B:
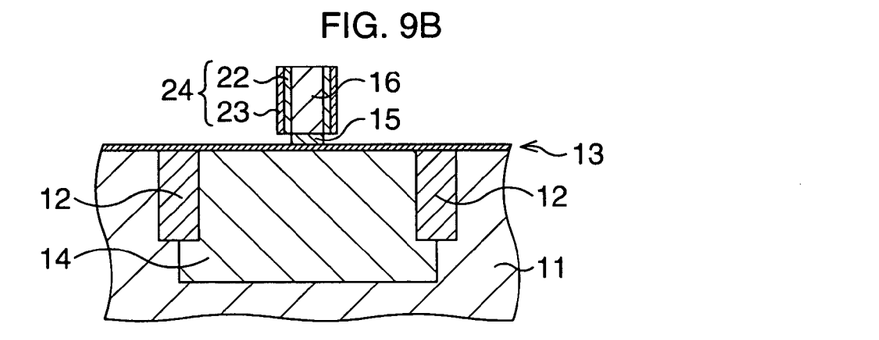

Then, as shown in FIG. 9B, after a gate insulating film 15 is formed on the surface of the p-well 14 by the oxidation method, a polycrystalline silicon film deposited by the CVD method (and the gate insulating film 15) is processed by photolithography and dry etching, to form a gate electrode 16 in a pattern.

Thin silicon oxide films 22 and thin silicon nitride films 23 are deposited on the whole surface by the CVD method. Then, the silicon oxide films 22 and the silicon nitride films 23 are so processed as to cover the gate electrode 16 only on both sides of the gate electrode 16 by etch back. Then, the silicon oxide films 22 and the silicon nitride films 23 below the gate electrode 16 are removed by wet etching to form thin side walls 24. The gate electrode 16 takes the shape of a notch due to the side walls 24.

Figure 9C:
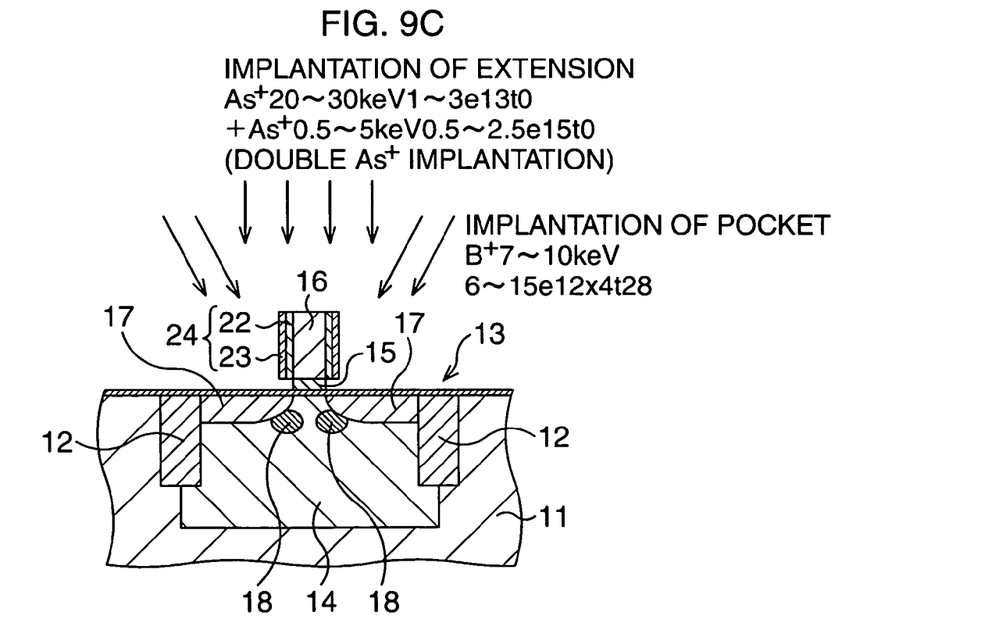

Then, as shown in FIG. 9C, extension regions 17 as shallow junction are formed by double ion implantation. To be more specific, an n-type impurity less diffusive than phosphorus (P⁺), for example, arsenic (As⁺) ions are implanted with high acceleration energy and low dose in the surface layer of the semiconductor substrate 11 by use of the gate electrode 16 and the side walls 24 as a mask ($E_H D_L$ ion implantation). Then, As⁺ ions are further implanted with lower acceleration energy and higher dose than those of $E_H D_L$ ion implantation ($E_L D_H$ ion implantation), to form the extension regions 17. The $E_H D_L$ ion implantation is carried out on the condition that the acceleration energy is 20 keV to 30 keV, the dose is $1 \times 10^{13}/cm^2$ to $3 \times 10^{13}/cm^2$, and a tilt angle is 0° (the vertical direction). The $E_L D_H$ ion implantation is carried out on the condition that the acceleration energy is 0.5 keV to 5 keV, the dose is $0.5 \times 10^{15}/cm^2$ to $2.5 \times 10^{15}/cm^2$, and the tilt angle is 0°.

Then, in a like manner, a p-type impurity, for example, boron (B⁺) ions are implanted from four directions with the acceleration energy of 7 keV to 10 keV, the dose of $6 \times 10^{12}/cm^2$ to $15 \times 10^{12}/cm^2$, and the tilt angle of 28° by use of the gate electrode 16 and the side walls 24 as a mask, to form pocket regions 18. Then, anneal processing is carried out at a predetermined temperature, in order to activate As in the extension regions 17.

Figure 10A:
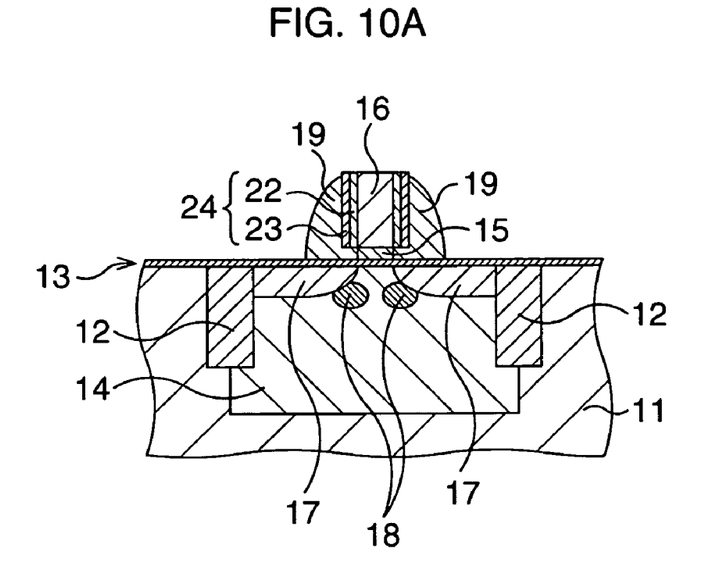
FIGS. 10A and 10B are schematic sectional views showing the manufacturing method of the MOS transistor according to the second embodiment in processing order, as a follow-up to FIG. 9C.

Then, as shown in FIG. 10A, silicon oxide films are deposited on the whole surface of the semiconductor substrate 11 by the CVD method. Since the whole surface of the silicon oxide films is processed by anisotropic dry etching (etch back), the silicon oxide films deposited only on both sides of the gate electrode 16 (and the gate insulating film 15) via the side walls 24 form side walls 19.

Figure 10B:
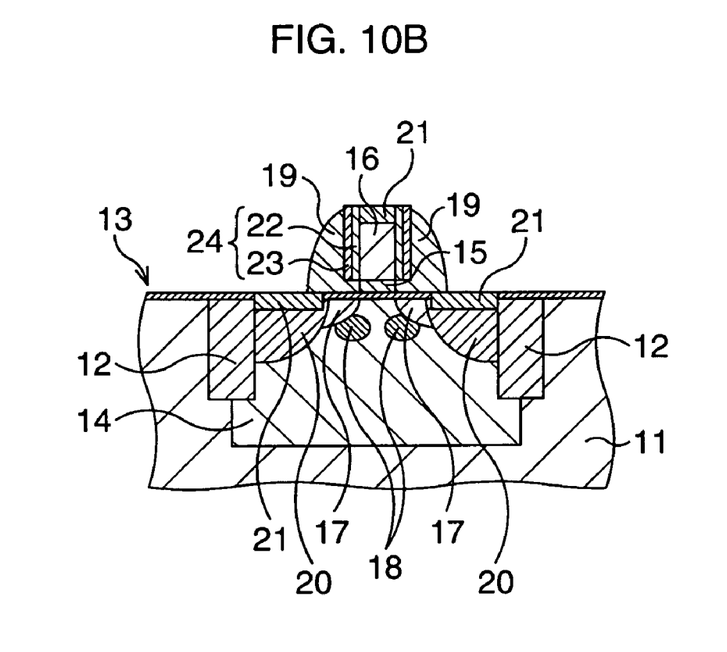

Then, as shown in FIG. 10B, an n-type impurity, for example, phosphorus (P⁺) ions are implanted in the surface layer of the semiconductor substrate 11 by use of the gate electrode 16 and the side walls 19 as a mask. Thus, a source/drain 20 as a deep junction is so formed as to overlap with the extension regions 17 with leaving a part of the extension regions 17 existing under the gate electrode 16. Then, anneal processing is carried out at a predetermined temperature, in order to activate As in the source/drain 20.

Then, silicide layers, for example, CoSi layers 21 are formed in each surface of the gate electrode 16 and the source/drain 20 by the so-called salicide process, and unreacted Co is removed. After that, an interlayer insulating film covering the whole surface is formed, and various wiring processes and the like are carried out to complete the MOS transistor.

According to this embodiment, standby power is reduced because the leak between a body and the drain is reduced with restraining the effect on the threshold voltage ($V_{th}$). Therefore, it is possible to realize the highly reliable MOS transistor.

What is claimed is:

1. A method for manufacturing a semiconductor device comprising the steps of:
    forming a gate over a semiconductor region;
    forming a first junction by doping an n-type impurity less diffusive than phosphorus in the semiconductor region by using the gate as a mask; and
    forming a second junction by doping an n-type impurity in the semiconductor region by using at least the gate as a mask, the second junction being deeper than the first junction, the second junction overlapping with the first junction with leaving a part of the first junction existing under the gate, wherein
    the step of forming the first junction includes at least a first ion implantation which is carried
    out with a first acceleration energy and a first dose, and a second ion implantation which is carried out with a second acceleration energy higher than the first acceleration energy and a second dose lower than the first dose.

2. The method for manufacturing a semiconductor device according to claim 1, wherein
    in the step of forming the first junction,
    arsenic is used as the less diffusive n-type impurity.

3. The method for manufacturing a semiconductor device according to claim 2, further comprising the step of forming side walls over both sides of the gate, and wherein
    the step of forming the second junction is carried out by using the gate and the side walls as a mask.

4. The method for manufacturing a semiconductor device according to claim 3, further comprising the step of doping a p-type impurity in the surface layer of the semiconductor region by using the gate as a mask.

5. The method for manufacturing a semiconductor device according to claim 1, wherein
    the step of forming the first junction includes a third ion implantation which is carried out with a third acceleration energy and a third dose, in addition to the first and second ion implantations.

6. The method for manufacturing a semiconductor device according to claim 1, further comprising the step of forming side walls over both sides of the gate, and wherein
    the step of forming the second junction is carried out by using the gate and the side walls as a mask.

7. The method for manufacturing a semiconductor device according to claim 1, further comprising the step of processing the gate to take the shape of a notch, and wherein
    the step of forming the first junction is carried out by using the gate in the shape of the notch as a mask.

8. The method for manufacturing a semiconductor device according to claim 1, further comprising the step of doping a p-type impurity in the surface layer of the semiconductor region by using the gate as a mask.

9. The method for manufacturing a semiconductor device according to claim 1, wherein
    the second ion implantation is carried out with the acceleration energy of 20 keV to 30 keV and the dose of 1×1013/cm2 to 3×1013/cm2.

10. The method for manufacturing a semiconductor device according to claim 9, wherein
    in the step of forming the first junction, arsenic is used as the less diffusive n-type impurity.

* * * * *